METHOD OF MANUFACTURING A DISPLAY SCREEN

Filed June 30, 1970

2 Sheets-Sheet 1

WITNESSES

Theodore F. Wrobel

James F. Young

INVENTORS

Kenneth L. Rohrer, Douglas A. Griswold and David H. Davies

BY Charles F. Renz

ATTORNEY

United States Patent Office 3,712,815
Patented Jan. 23, 1973

3,712,815

METHOD OF MANUFACTURING A DISPLAY SCREEN

Kenneth L. Rohrer, Horseheads, N.Y., and Douglas A. Griswold, Blossburg, and David H. Davies, Pittsburgh, Pa., assignors to Westinghouse Electric Corporation, Pittsburgh, Pa.

Filed June 30, 1970, Ser. No. 51,144
Int. Cl. G03c 5/00
U.S. Cl. 96—36.1 7 Claims

ABSTRACT OF THE DISCLOSURE

An improved method of manufacturing a display screen for a cathode ray tube in which a light absorbing coating is provided on the display screen and surrounds the phosphor elements positioned on the display screen. This is accomplished by providing an array of polyvinyl alcohol (PVA) dots on the faceplate corresponding to the desired phosphor arrays, providing a coating of light absorbing material over the PVA dots and the intervening exposed surfaces of the faceplate, and then removing the PVA dots and the opaque coating covering the dots by chemically developing the PVA dots with a suitable oxidizing agent such as hydrogen peroxide and a chelating agent.

BACKGROUND OF THE INVENTION

This invention is related to the method of providing a screen structure in which a plurality of display elements are provided on the screen and which is an opaque coating surrounds these display elements to provide a light absorbing layer between the display elements of the display screen. This structure is more completely described in U.S. Pat. 2,842,697, entitled "Beam-Intercepting Structure for Cathode Ray Tube" by Frank J. Bingley. This patent discloses several methods for providing the opaque coating on a color television tube of the type referred to as a shadow mask type of display. This patent discloses the possibilities of exposing a photosensitive layer to light through the conventional mask, applying an opaque coating on the photosensitive layer and then removing the exposed portions of the photosensitive layer including the opaque coating on these exposed portions to provide openings in the opaque layer onto which the phosphor dots will be applied. This type of process utilizes a photosensitive material which on being exposed to light is easily removable in a subsequent washing or dissolving process.

This type of process has not adapted itself to commercial production and the present practice is to deposit a photosensitive layer of a material which exhibits the property of becoming insoluble on exposure to light. This latter type of photosensitive type material adapts itself to commercial production in that the manufacturing steps do not require an excessive amount of time. The present process is to deposit a photosensitive layer on the glass, expose this layer through the mask to light sources corresponding to the red, green and blue electron guns and then washing the unexposed portion of the photosensitive layer from the faceplate. After this process, a coating of a suitable black or opaque material such as graphite is flowed over the faceplate so to cover both the uncovered portions of the faceplate and the exposed photosensitive dots. The next step is to chemically treat this combination layer so as to cause the removal of the exposed photosensitive dots from beneath the black coating and thereby also remove the black coating deposited on the exposed photosensitive dots leaving the desired light absorbing coating pattern. It is to this latter process that this invention is directed and more particularly to an improved method of chemically treating the exposed photosensitive layer dots to remove them from the screen.

SUMMARY OF THE INVENTION

This invention describes a particular method of fabricating a display screen wherein an opaque coating is provided to surround the phosphor display elements to improve the brightness and contrast of the display screen. More particularly this invention is directed to the method of providing an opaque coating on the display screen of shadow mask type color television tube wherein a photosensitive layer is deposited on the faceplate and exposed to light sources representing the red, green and blue electron guns through the mask. The unexposed portion of the photosensitive layer is then removed so that an array of exposed photosensitive dots is provided on the faceplate corresponding to the three color phosphor array. A black coating is then provided over this exposed photosensitive dot array and the uncovered surface of the faceplate. By treating the exposed photosensitive dots on the display screen by a chemical developer including a suitable solution consisting of an oxidizing agent such as hydrogen peroxide and a chelating agent such as a sodium salt of ethylenediaminetetraacetic acid, one is able to cause the swelling of the exposed photosensitive dots to permit removal of the exposed photosensitive dots and the opaque coating thereon to provide a black coating on the faceplate with openings therein corresponding to the array of phosphor display elements that are deposited on the screen in later processes.

BRIEF DESCRIPTION OF THE DRAWING

For a better understanding of the invention, reference may be had to the preferred embodiment, exemplary of the invention, shown in the accompanying drawing, in which.

DESCRIPTION OF THE PREFERRED EMBODIMENT

Figures 1, 2:
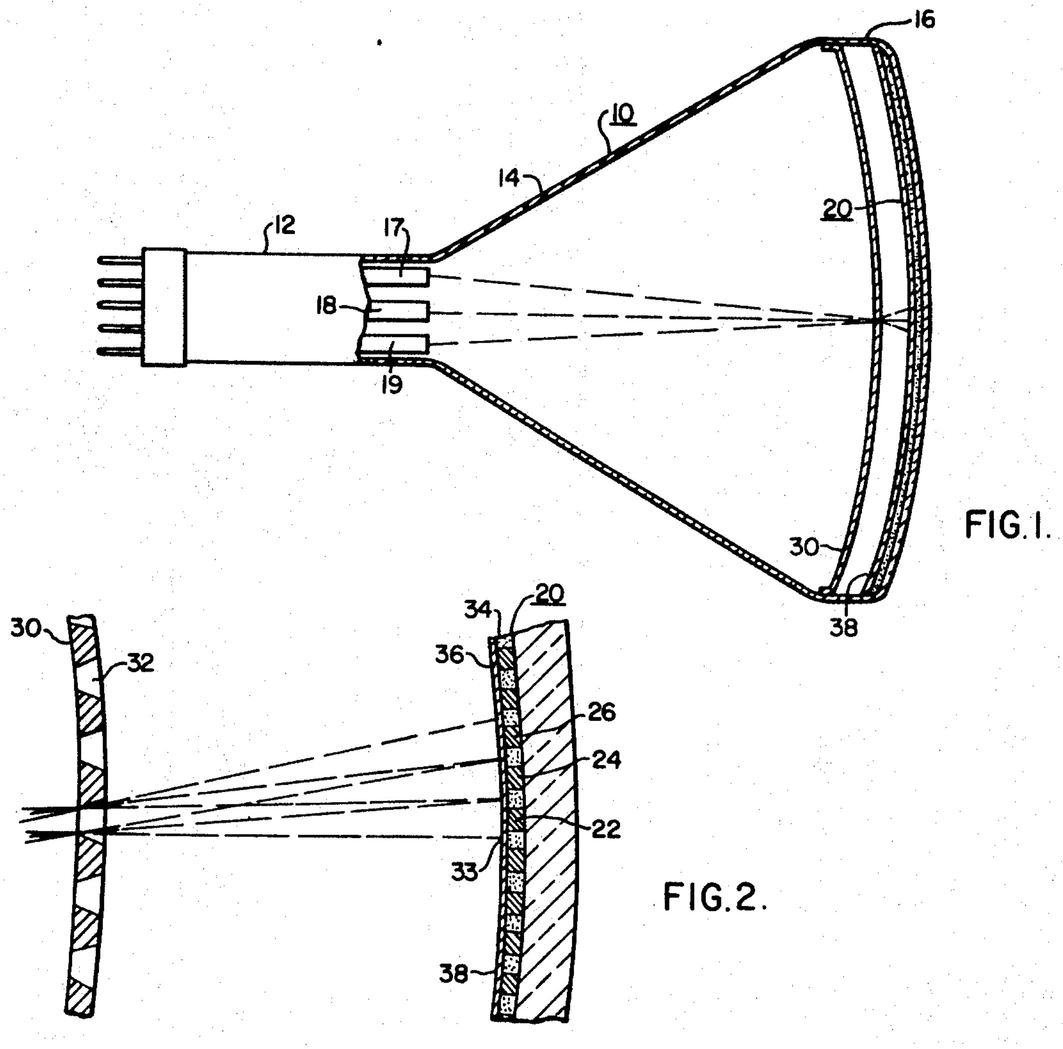
FIG. 1 is a sectional view of one form of cathode ray tube in which the present invention is particularly applicable.
FIG. 2 is an enlarged cross-sectional view of a portion of the cathode ray tube shown in FIG. 1.

The color television tube and screen illustrated in FIGS. 1 and 2 is similar in form to certain prior art structures. The cathode ray tube consists of an envelope 10. The envelope 10 comprises a neck portion 12, a flared portion 14 and a face panel portion 16. Positioned within the envelope 10 are three electron guns 17, 18 and 19 which may be respectively modulated with red, green and blue video information. A display screen 20 is provided on the inner surface of the faceplate of the panel 16. The display screen 20 consists of a plurality of phosphor dots 22, 24 and 26 which may be respectively phosphor materials capable of emission of red, green and blue light in response to electron excitation. These phosphor dots are arranged in a triad type arrangement as well known in the art, so that each triad consists of a red, green and blue phosphor dot.

Positioned between the display screen 20 and the electron guns 17, 18 and 19 is a shadow mask 30 which includes a plurality of apertures 32. The apertures 32 and the phosphor dots 22, 24 and 26 are arranged in such a manner that the electron beam generated by the red gun 17 will pass through an aperture 32 and excite only the phosphor dot 22. The green electron gun 18 will excite only the green phosphor dot 24 and the blue gun 19 will excite only the blue phosphor dot 26.

As shown in FIG. 2, the electron beam striking the display screen 20 will have a diameter 33 of about .014 inch while the phosphor dots 22, 24 and 26 will have a diameter of about .018 inch. The apertures 32 in the mask 30 have an opening of about .012 inch in diameter.

The display screen 20 comprises an opaque coating 34 in which openings 36 are provided and are aligned to correspond with the phosphor dots 22, 24 and 26. The openings 36 may be of a slightly less diameter than the phosphor dots 22, 24 and 26. It is also normal to provide a conductive coating 38 such as aluminum over the entire screen structure. The above structure and the operation of FIGS. 1 through 2 are well known in the art.

Figure 3:
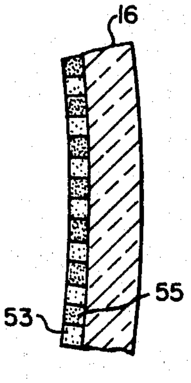
FIGS. 3 through 5 illustrate successive steps in the screen method making of the present invention.
Figure 4:
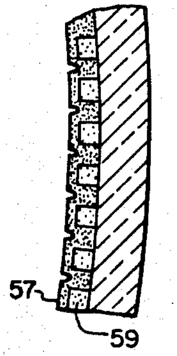
Figure 5:
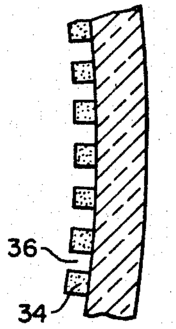
Figure 6:
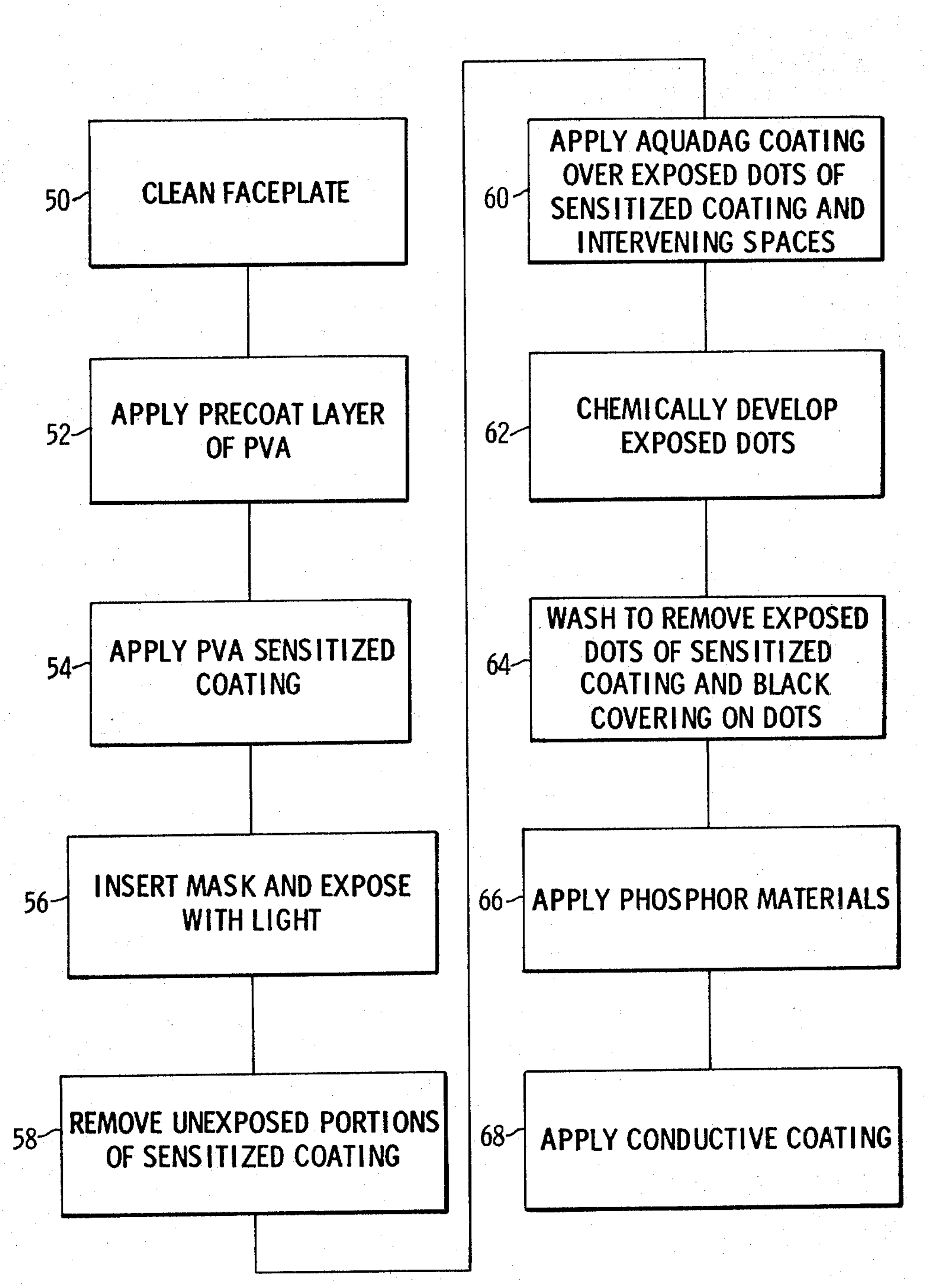
FIG. 6 is a flow chart illustrating the process steps employed in one embodiment of the invention.

The preferred manner of forming the display screen 20 on the faceplate 16 is best illustrated by the flow chart in FIG. 6 and the illustration shown in FIGS. 3 through 5. Referring now to FIG. 6, block 50 represents the first operation performed on the tube panel which is simply to clean the surface. This may be accomplished by washing with an aqueous solution of 7% by weight hydrofluoric acid and then rinsing with deionized water.

At 52, a thin precoat layer of PVA may be applied on the inner surface of the face panel 16. This coating is applied on the still wet panel and then spun and dried by infrared heaters. The composition of this precoat is an aqueous solution of about .037% by weight PVA Du Pont Grade 72–60. In block 54, an aqueous solution of about 2% by weight PVA is flowed onto the panel and spun and dried as in step 52. The PVA solution may include 2% by weight of Airco Type 540 PVA sensitized with a suitable sensitizer such as ammonium dichromate at a .125 ammonium dichromate to PVA ratio and adjusted to a pH of 9.0 with ammonium hydroxide. The resultant viscosity is about 10 centipoise.

In block 56, the aperture mask 30 is inserted into the panels 16. Three individual exposures are made by suitable light sources through the mask so that dot images are made in the PVA coating 53 as illustrated in FIG. 3 to correspond to the positions of the eventual green, blue and red phosphor dots.

In block 58, the mask is removed and the PVA coating 53 is subjected to a spray of deionized water developer to rinse away the soluble unexposed PVA areas 55 on the panel so as to leave PVA dots corresponding to the positions of the eventual green, blue and red phosphor dots. The PVA dot pattern is then spun and dried under infrared heat.

In block 60, a suitable opaque coating such as a 4% by weight Aquadag suspension is applied to the panel completely covering the dots and all adjacent areas as illustrated in FIG. 4. The black coating is illustrated as 57 and the exposed dots are illustrated as 59. Aquadag is a 22% by weight high viscosity dispersion of graphite in water and may be purchased from Acheson Colloids Company of Port Huron, Mich.

The next step in the operation is illustrated by block 62 and is to chemically develop the dots 59 on the panel. It is necessary to provide a suitable chemical developer capable of rapidly penetrating the relatively nonporous black layer and attacking the PVA which is known for its resistance to chemicals. By providing a suitable oxidizing agent and suitable chelating agent under suitable conditions, one is able to remove the PVA dots and covering black coating within a reasonable time and leave the intervening black coating. Suitable oxidizing agents are chlorine, hydrogen peroxide, sodium perborate, sodium hypochlorite and sodium peroxide. Suitable chelating agents are tetrasodium salt of ethylenediaminetetraacetic acid or ammonium salt of the acid or potassium salt of the acid. In addition, the pentasodium salt of diethylenetriaminepentaacetic acid may be used. This latter chelating agent may be purchased as Versenex® 80 from Dow Chemical Co., Midland, Mich.

One specific embodiment comprises the steps of providing a weak aqueous solution of hydrogen peroxide such as 1 percent by weight as the oxidizing agent. A suitable chelating agent is tetrasodium salt of ethylenediaminetetraacetic acid in solution such as an aqueous solution 39 percent by weight and sold under the trade name Versene 100 by Dow Chemical Co., Midland, Mich. The oxidizing solution is heated to a temperature of about 50° C. The chelating solution is at room temperature. The two solutions are mixed just prior to introduction into the faceplate with the ratio of oxidizing solution to chelating solution being about 100 vol. to 1 vol. One gallon of the solution is introduced into the panel for about 10 seconds at the end of this time the solution is removed.

The chemical developer attacks the PVA with the oxidizing agent causing the swelling of the PVA dots and the chelating agent breaking the cross link between the PVA and the chromium. The chelating agent solubilizes the chromium. In step 64, the portion of the PVA dots 59 and the coating 57 remaining after step 2 are removed by a spray of deionized water for a period of time for about 40 seconds. The result is a black surround matrix coating 34 illustrated in FIG. 5.

Developing time for the black matrix is not only dependent upon the concentrations of hydrogen peroxide and Versene 100 in the developer mixture, but upon the temperature of the developer mixture itself. While developer temperatures of about 20° C. will develop the matrix satisfactorily, contact time for the peroxide-Versene mixture is reduced to the order of seconds, instead of minutes, when the mixture is heated to 50° C. In some manufacturing lines, developing times in minutes are deemed too long and impracticable. Higher temperatures than 50° C. may be used to achieve shorter developing times, but with some precaution to avoid thermal shock and breakage of the glass panel. Similarly, lower concentrations of peroxide-Versene mixture may be used at a sacrifice of developing speed, and higher concentrations may be used at a sacrifice of economy.

In the next block 66, the phosphor dots are deposited onto the display screen in a well known manner to provide the phosphor dot structure as illustrated in FIG. 2. Block 68 illustrates the well known technique of applying the conductive coating 38 over the phosphor display screen and this may be accomplished by any conventional well known technique.

We claim as our invention:

1. A method of establishing a light absorbing design on a screen substrate of an image display device in areas between predetermined light emitting design, said method comprising the following steps:

applying to said substrate a coating of a photosensitized polyvinyl alcohol which exhibits the property of becoming less soluble on exposure to radiations;

exposing said sensitized polyvinyl alcohol coating to actinic radiation and of a design corresponding to said light emitting design;

developing the exposed sensitized polyvinyl alcohol coating to remove the unexposed areas of said coating;

applying to said substrate a coating of an opaque material to cover said coating of sensitized polyvinyl alcohol coating corresponding to the light emitting design and the exposed substrate surface corresponding to the light absorbing design;

chemically developing said exposed sensitized polyvinyl alcohol coating corresponding to said light emitting design by application of a chemical developer which comprises a mixture of an oxidizing agent in a weak aqueous solution heated to a temperature above room temperature and mixed with an aqueous solution of a chelating agent just prior to application to said polyvinyl alcohol coating to loosen said sensitized polyvinyl alcohol coating and thereafter removing the exposed sensitized polyvinyl alcohol coating and the opaque coating thereon to provide an opaque coating on said screen substrate corresponding to said light absorbing design.

2. The method of claim 1 in which said oxidizing agent is hydrogen peroxide.

3. The method of claim 1 in which said chelating agent is selected from a salt of acetic acid.

4. The method of claim 1 in which said chelating agent is a salt of ethylenediaminetetraacetic acid.

5. The method of claim 1 in which said chemical developer is a mixture of a first aqueous solution of 1% by weight of hydrogen peroxide and a second aqueous solution of 39% by weight of a sodium salt of ethylenediaminetetraacetic acid in the volume ratio of the first solution to the second solution is about 100:1.

6. The method set forth in claim 1 in which the temperature is about 50° C.

7. The method set forth in claim 1 in which said sensitized polyvinyl alcohol coating is sensitized by the addition of ammonium dichromate.

References Cited

UNITED STATES PATENTS

| | | | |
|---|---|---|---|
| 2,840,470 | 6/1958 | Levine | 96—36.1 |
| 2,886,532 | 5/1959 | Richmond et al. | 252—186 |
| 3,175,907 | 3/1965 | Fishman | 96—36.3 |
| 3,558,310 | 1/1971 | Mayaud | 96—36.1 |

J. TRAVIS BROWN, Primary Examiner

M. F. KELLEY, Assistant Examiner

U.S. Cl. X.R.

96—36; 117—33.5 CM